United States Patent [19]

Chakravarti et al.

[11] Patent Number: 5,643,640
[45] Date of Patent: Jul. 1, 1997

[54] FLUORINE DOPED PLASMA ENHANCED PHOSPHO-SILICATE GLASS, AND PROCESS

[75] Inventors: Ashima B. Chakravarti, Hopewell Junction, N.Y.; Terry M. Cheng, Allentown, Pa.; Son Van Nguyen, Hopewell Junction; Michael Shapiro, Beacon, both of N.Y.

[73] Assignee: International Business Machines Corporation, Armonk, N.Y.

[21] Appl. No.: 563,165

[22] Filed: Nov. 27, 1995

[51] Int. Cl.$^6$ .................................................. B05D 3/06
[52] U.S. Cl. .................. 427/578; 427/255; 427/255.1; 427/255.2
[58] Field of Search ........................ 427/578, 574, 427/255, 255.1, 255.2

[56] References Cited

U.S. PATENT DOCUMENTS

| | | | |
|---|---|---|---|
| 4,300,989 | 11/1981 | Chang | 204/164 |
| 4,535,528 | 8/1985 | Chen et al. | 29/571 |
| 4,894,352 | 1/1990 | Lane et al. | 437/238 |
| 5,037,514 | 8/1991 | Yamazaki | 204/157.45 |
| 5,120,680 | 6/1992 | Foo et al. | 437/238 |
| 5,215,787 | 6/1993 | Homma | 427/248.1 |
| 5,275,977 | 1/1994 | Otsubo et al. | 437/235 |
| 5,334,454 | 8/1994 | Caporiccio et al. | 428/412 |

FOREIGN PATENT DOCUMENTS 5-267480  10/1993  Japan.

*Primary Examiner*—Roy V. King
*Attorney, Agent, or Firm*—Perman & Green; Charles W. Peterson, Jr.

[57] ABSTRACT

A fluorinated phosphosilicate glass (FPSG) is produced in a plasma-enhanced chemical vapor deposition process (PECVD) in which the plasma source comprises conventional phosphosilicate glass-forming materials together with one or more fluorine gas-forming materials. The deposited fluorine-gas enhances the filling of gaps or voids with dielectric glass compositions by etching the top of the via holes or gaps during the filling operation. The present fluorine-doped phosphosilicate glass compositions are stable compared to conventional phosphosilicate glass compositions which are relatively unstable and unsatisfactory for use as gap-filling dielectric glass compositions.

8 Claims, 3 Drawing Sheets

FLUORINE DOPED PLASMA ENHANCED PHOSPHO-SILICATE GLASS, AND PROCESS

BACKGROUND OF THE INVENTION

1. Field of the Invention

The present invention relates to the production of novel phosphosilicate glass (PSG) dielectric compositions having improved gap-fill properties and a low dielectric constant, whereby via holes and interlevel dielectric layers can be completely deposited in a single continuous operation to the exclusion of voids, and the deposited PSG has a low dielectric constant and sodium-barrier properties.

2. State of the Art

A wide variety of glass compositions, including phosphosilicate glass compositions are known as gap-fill and interlevel dielectric compositions. Generally such gap-fill compositions are deposited in multiple deposition/multiple etch steps in order to fill the gaps or vias incrementally and prevent the trapping of gases which can produce voids in the deposit. Such procedure is time-consuming, expensive and reduces efficiency.

It is known that several modified dielectric glass compositions have better gap-fill properties than conventional silica glass compositions, including boron-containing phosphosilicate glass, and phosphorous-doped spin-on glasses. However, there is a need for a gap-fill glass composition having better gap-filling properties and having a lower dielectric constant than compositions currently available.

It is also known that the presence of fluorine-containing gas enhances the filling of gaps or voids with dielectric glass compositions by etching the top of the via holes or gaps during the filling operation. However, conventional phosphosilicate glass compositions are relatively unstable and unsatisfactory for use as gap-filling dielectric glass compositions.

Reference is made to U.S. Pat. No. 4,535,528 which discloses a process for enhancing the reflow properties of phosphosilicate glass by the implantation of arsenic ions.

Reference is made to U.S. Pat. No. 5,275,977 which discloses a CVD process for depositing and simultaneously etching a silicon oxide dielectric layer from a film-forming plasma containing a fluorine gas.

Reference is made to U.S. Pat. No. 5,215,787 which discloses a process for the chemical vapor deposition of a dielectric silicon oxide film containing fluorine from an alkoxy-fluorosilane.

SUMMARY OF THE INVENTION

The present invention is based upon the discovery that fluorine-doped phosphosilicate glass compositions can be produced by a plasma-enhanced chemical vapor deposition process, and that such compositions have better gap-filling properties and a lower dielectric constant than conventional fluorine-doped silicon oxide glass compositions or undoped phosphosilicate glass compositions.

According to the present invention, a fluorinated phosphosilicate glass (FPSG) is produced in a conventional plasma-enhanced chemical vapor deposition process (PECVD) in which the plasma source comprises conventional phosphosilicate glass-forming materials together with one or more fluorine gas-forming materials. The deposited fluorine-doped plasma-enhanced phosphosilicate (FPEPSG) glass films have greater stability than the corresponding phosphosilicate glass which is not doped with fluorine, and also has improved gap-filling properties and a lower dielectric constant than said undoped PSG.

THE DRAWINGS

FIG. 1 is a schematic illustration of a typical plasma-enhanced chemical vapor deposition apparatus suitable for use according to the present apparatus.

FIG. 2 is a graph showing a fourier transform IR-absorption (FTIR) spectra of a PSG film produced with zero flow of $C_2F_6$ gas, and a FPSG dielectric film produced according to the present invention, illustrating the absorption peaks corresponding to the Si(OH) contents, and FIG. 3 is a comparative FTIR spectra of PSG, and the FPSG dielectric films, illustrating the absence of any absorption peak corresponding to fluorine content, in the PSG film, and absorption peaks corresponding to the Si—F bond content in the FPSG film produced during introduction of $C_2F_6$ according to the present invention.

DETAILED DESCRIPTION

Figure 1:
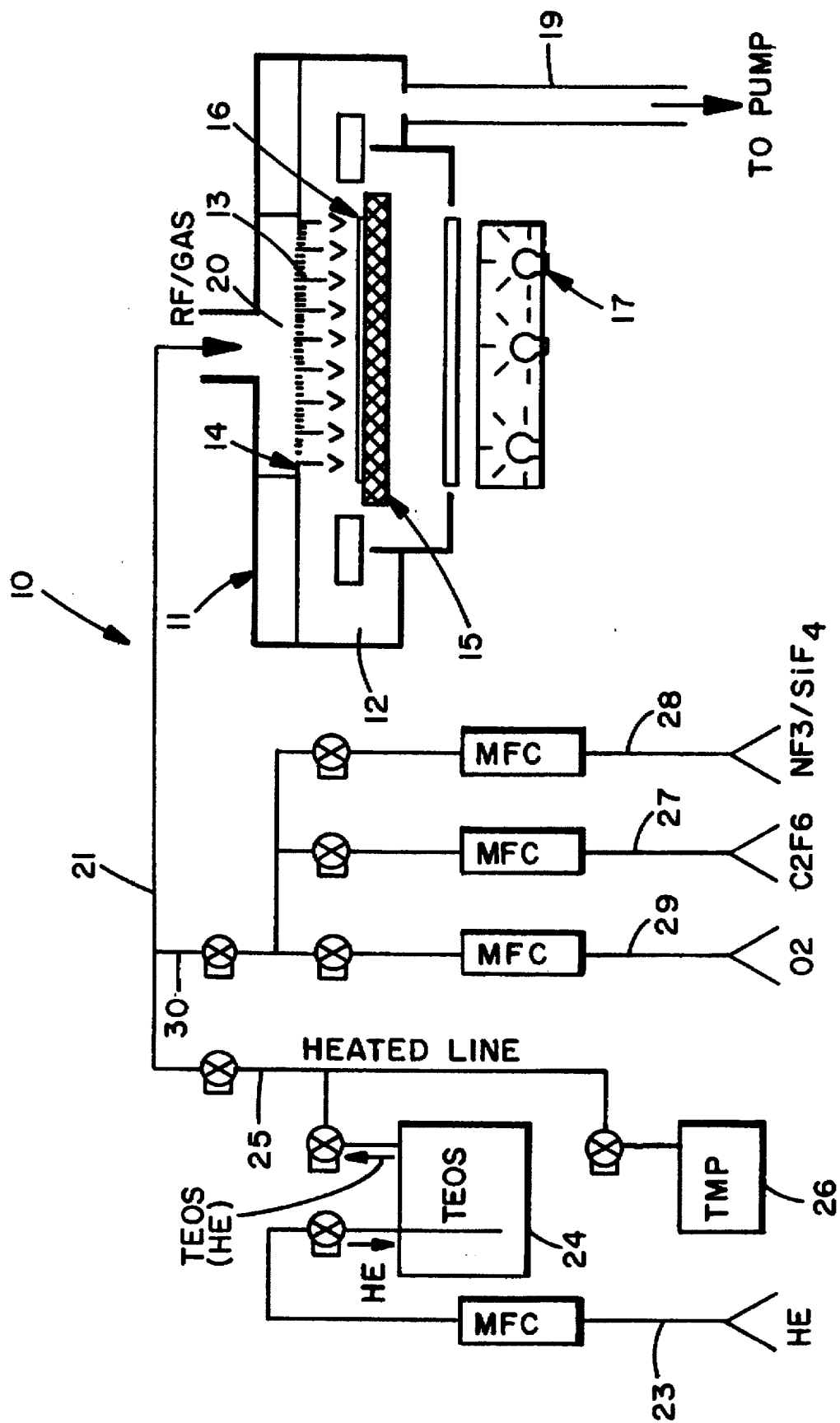

The novel process of the present invention is similar to conventional CVD processes and materials for depositing phosphosilicate glass films using a conventional apparatus, such as illustrated by FIG. 1 of the present drawings. The novelty is imparted by the inclusion of a fluorine-generating additive material which imparts fluorine gas to the plasma from which the dielectric glass film is deposited and results in the deposition of a modified PSG composition, namely a fluorine-doped PSG composition, having enhanced gap-fill properties and a reduced dielectric constant (enhanced insulation properties).

The apparatus 10 of FIG. 1 comprises a chemical vapor deposition reactor 11 having a deposition chamber 12, a perforated showerhead 13 comprising an upper electrode 14, and a lower heated susceptor electrode 15 for supporting the substrate 16 being coated, such as a silicon wafer, to a suitable temperature, such as between 400° and 500° C. Heating of the susceptor 15 is accomplished by a bank 17 of heating lamps focused through a quartz window 18 in the reactor 11 adjacent the underside of the susceptor 15. The deposition chamber 12 is maintained under a suitable vacuum pressure by communication with a vacuum pump through vacuum conduit 19.

The reactant and carrier gases are fed to a mixing chamber 20 while radio frequency energy is also supplied to the upper electrode 14.

The apparatus of FIG. 1 illustrates the individual reactant and carrier gas supply systems including mass flow rate controllers (MFC) and valved conduits communicating with each other into the main gas supply conduit 21 to the mixing chamber 20.

The essential preferred reactants are tetraethoxy silane (TEOS) and trimethyl phosphate (TMP) both of which are liquids. Helium, a carrier gas, is bubbled through a container 24 of liquid TEOS through a conduit 23, to release a mixture of TEOS and helium into a heated conduit 25 opening into the main gas supply conduit 21. Also opening into the heated conduit 25 is a supply of the other reactant liquid TMP in supply container 26, which becomes volatilized by the heat and vacuum pressure exerted within the heated conduit 25 by communication with the reactor 11.

The fluorine containing gases $C_2F_6$ and $SiF_4/NF_3$ are supplied through conduits 27 and 28, respectively, and oxygen gas is supplied through conduit 29, each of these conduits opening into common conduit segment 30 communicating with the main gas supply conduit 21 to the reactor.

Plasma-forming materials and conditions for the chemical vapor deposition of phosphosilicate glass dielectric films are well known to those skilled in the art. Preferred reactant gases are tetraethoxy silane (TEOS or $Si(OEt)_4$) and trimethyl phosphate (TMP or $PO(OCH_3)_3$) in the presence of oxygen and helium gases. The apparatus is operated at between about 500–600 W, at a pressure between about 5 and 10 Torr and at a temperature between about 400°–500° C.

The fluorine-doping is accomplished by the inclusion of one or more fluorine gas-generating materials, e.g., a fluorinated hydrocarbon gas such as $C_2F_6$ or $NF_3$, or more preferably, a compound having fluorine bonded to silicon or to another glass-forming element, such as $SiF_4$.

The relative extent of fluorine doping of the formed FPSG deposit films is variable and depends upon the amount of fluorine-containing material introduced, i.e., the rate of introduction of $C_2F_6$ gas relative to the rate of introduction of the PSG-forming reactants as regulated by the flow rate controllers. In general, it appears that PSG films doped with the incorporation of at least about 0.1 mole % of fluorine exhibit enhanced gap-fill properties and reduced dielectric constant as compared to the undoped PSG.

Substantially enhanced properties are produced when the fluorine content is between about 0.5% and 3 mole %.

The presence of the fluorine-imparting material, such as $C_2F_6$ and $SiF_4$ gas, has a strong effect upon the deposition rate of the formed dielectric film and enables such rate to be reduced (in the case of $C_2F_6$) or increased (in the case of $SiF_4$) by increasing the content or rate of introduction of the fluorine-containing gas.

A critical feature of the present invention is that the fluorine doping of the phosphosilicate glass also stabilizes the glass, apparently by enhancing the formation of $P_2O_5$ and reducing the amount of $P_2O_7$ in the formed FPSG film. As a PSG is formed, two types of phosphorous-oxygen configurations are possible, namely a more stable $P_2O_5$ and a less stable $P_2O_7$. If $P_2O_7$ is present in the glass, Si(OH) is absorbed into the PSG film, which reduces the stability of the film and increases the dielectric constant. The FPSG dielectric films formed according to the present process contain substantially less Si(OH) than conventional PSG dielectric films which are not doped with fluorine, as established by the fourier transform IR-absorption spectra (FTIR) of FIG. 2.

The following specific example illustrates a suitable process and apparatus for producing the novel fluorine-doped phosphosilicate glass dielectric films according to a preferred embodiment of the present invention.

A conventional Applied Materials Precision 5000 CVD single frequency (13.56 MHz) apparatus, as illustrated by FIG. 1, is used at a power of 525 W, applied to the top electrode 14, at a pressure of 8.5 Torr drawn through conduit 19 and a susceptor temperature of 430° C. from lamps 17. The various reactants and carrier gases are introduced to the vacuum chamber 12 through the manifold or showerhead mixing chamber 22 at the following rates.

Helium carrier gas is supplied through conduit 23 and bubbled through a container 24 of liquid tetraethoxy silane (TEOS) to vaporize the TEOS in the helium and the mixture is introduced through heated conduit 25 and main 21 to the manifold at the rate of about 500 sccm. A container 26 of liquid TMP (trimethoxy phosphorous, $PO(OCH_3)_3$, is open to the manifold vacuum through heated conduit 25 and main 21, and vapors thereof are introduced at the rate of 36 sccm. Oxygen gas is fed through conduit 29 at about 900 sccm, and ethyl hexaflouride ($C_2F_6$) gas is fed through conduit 27 at rates varied between 0, 200 sccm and 400 sccm. Conduits 27, 28 and 29 feed into common conduit segment 30 to main conduit 21 to the reactor.

The various gases mix within the manifold 22 and exit into the vacuum chamber 12 to form a plasma due to the discharge of the RF energy between the upper electrode 14 and grounded lower susceptor electrode 15. The fluorinated plasma deposits as a fluorine-doped PSG film over the silicon wafer component 16 having a plurality of vias to be filled. The vias are evenly filled in a continuous deposition process in which the fluorinated gas etches the FPSG as it is being deposited. The etching appears to occur at the top or entrance of each via hole and keeps the hole from being closed or blocked until it is completely filled with the FPSG, thereby preventing the trapping of gas voids within the via holes and forming a barrier layer against the penetration of sodium which is corrosive to conductive metallurgy within the component.

The plasma formed in the absence of any $C_2F_6$ gas, i.e., when the valve on conduit 27 is closed, deposits more quickly and more heavily on the silicon wafer, blocking the via holes in some instances and trapping gas voids therewithin.

Under the aforementioned conditions, the deposition rate varies between 3800 A/minute, when no $C_2F_6$ is introduced, and 2200 A/minute, when 200 sccm of $C_2F_6$ is introduced. The FTIR spectra of FIGS. 2 and 3 illustrate the F and Si(OH) absorption peaks for the PSG deposit, formed when 0 sccm of $C_2F_6$ was introduced, and for the FPSG deposit, formed while 200 sccm of $C_2F_6$ was introduced, as regulated by the MFC on conduit 27.

Figure 2:
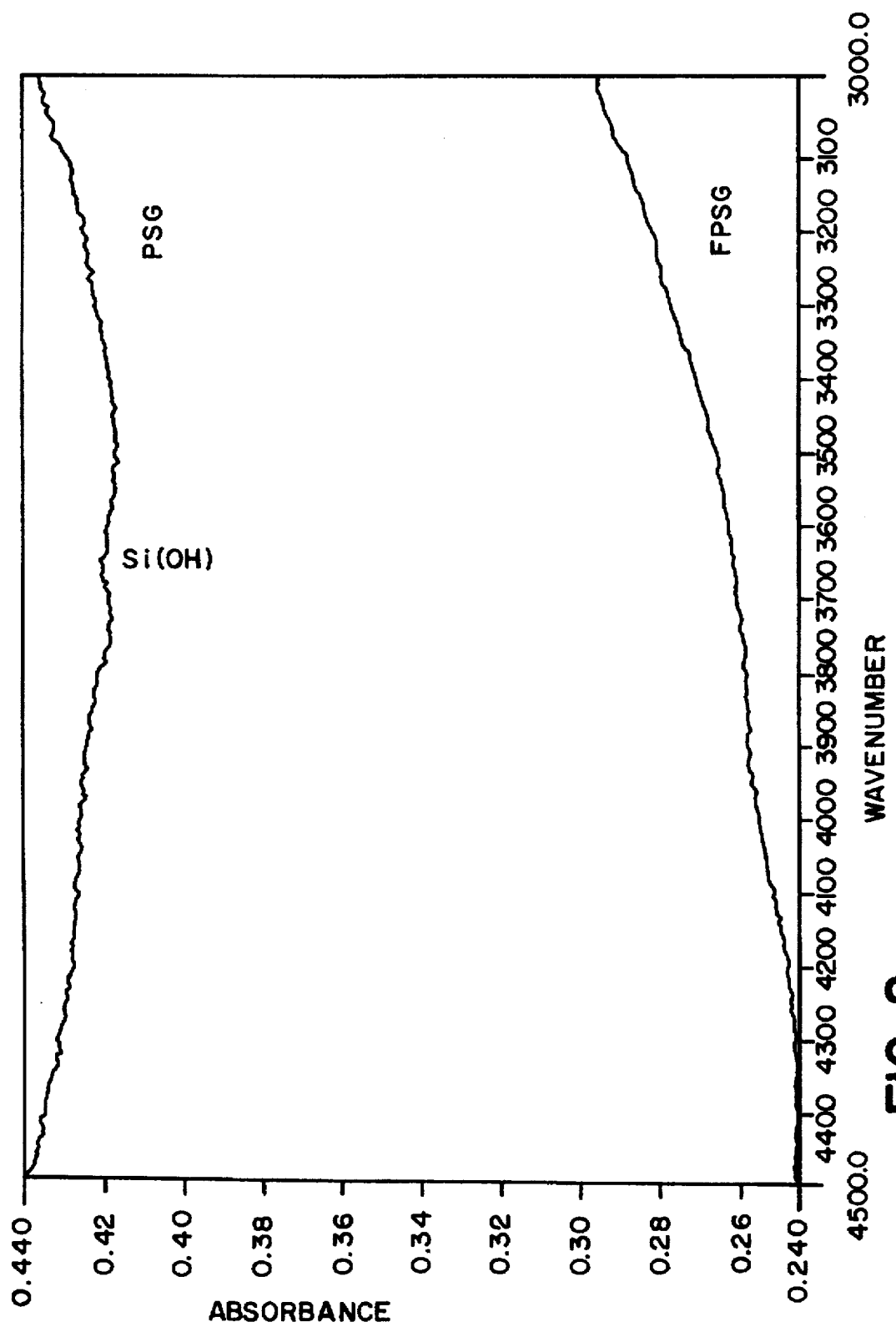
Figure 3:
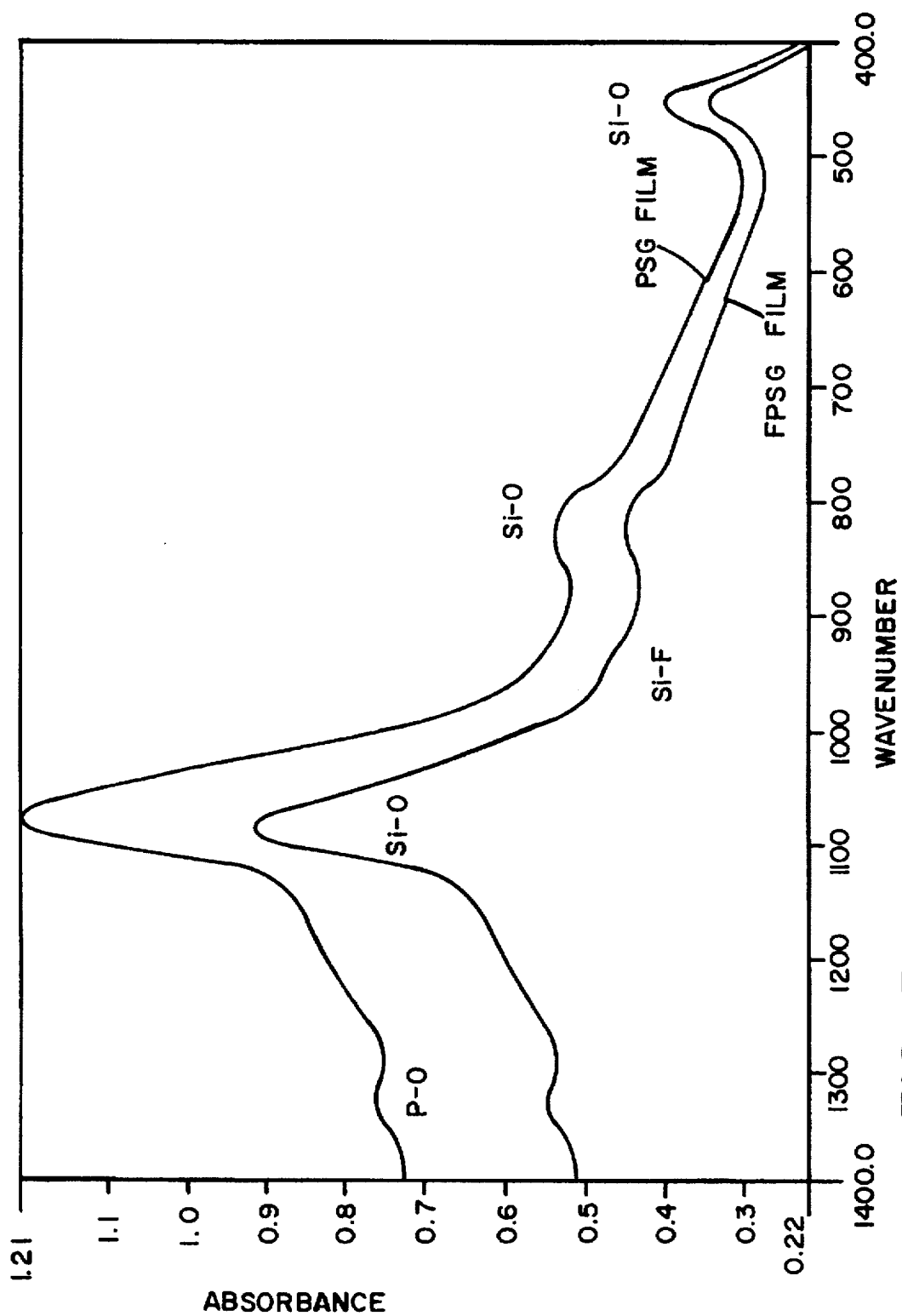

The FTIR spectra of FIG. 2 shows no Si(OH) absorption peak at 3650 cm for the fluorine-doped PSG dielectric material of the present invention whereas the PSG trace of FIG. 2 for the PSG formed during no flow of $C_2F_6$, shows a Si(OH) absorption peak at 3650 CM. The FTIR spectra of FIG. 3 show no Si-F absorption peak at 945 cm for the PSG film formed with no flow of $C_2F_6$ whereas the traces for the FPSG film show absorption peaks at 945 cm, indicating the incorporation of fluorine.

It will be apparent to those skilled in the art that the present FPSG dielectric layers preferably are applied to fill wide or high aspect ratio gaps or vias in dielectric wafer components such as electronic substrates or integrated circuit components. However such layers can also be applied as interlevel dielectric layers or as outer passivation layers which provide a sodium-barrier due to their content of phosphorous.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. Process for producing improved phosphosilicate glass dielectric compositions while reducing the dielectric constant thereof, which comprises introducing a supply of at least one fluorine-containing reactive gas to a chemical vapor deposition chamber containing reactive phosphosilicate glass-forming gases under a vacuum pressure and at a temperature between about 400° and 500° C., creating a plasma of said gases, and depositing said plasma as a fluorine-doped phosphosilicate glass dielectric containing between about 0.1 and 3 mole % of fluorine, said dielectric being capable of filling vias in a single continuous operation and having a lower dielectric constant than a corresponding dielectric composition produced in the absence of fluorine.

2. A process for depositing a fluorine-containing phosphosilicate glass dielectric layer on a silicon layer comprising the step of:

(a) supporting said silicon layer on a lower electrode having a positive uniformly spaced from an upper electrode connected to a source of RF energy, within chemical vapor deposition chamber connected to sources of a silicon-containing reactive gas and a phosphorous-containing reactive gas as phosphosilicate glass-forming reactants, and to a source of a fluorine-containing reactive gas;

(b) creating a vacuum within said chamber;

(c) introducing reactive proportions of said gases to said chamber while applying an RF potential across said electrodes, to create a gas plasma of said reactive gases;

(d) depositing a film of said plasma in the surface of said silicon layer in the form of a stable, fluorine-containing phosphosilicate glass containing between about 0.1 and 3 mole % of fluorine.

3. Process according to claim 2 in which said silicon layer contains at least one wide gap via, and the layer deposited in step (d) completely fills said via in a single continuous operation.

4. Process according to claim 1 in which said phosphosilicate glass-forming gases include a silicon-containing reactive gas and a phosphorous-containing reactive gas.

5. Process according to claim 1 in which said fluorine-containing gas comprises ethyl hexafluoride gas.

6. Process according to claim 2 in which said silicon-containing reactive gas comprises tetraethoxy silane.

7. Process according to claim 2 in which said phosphorous-containing reactive gas comprises trimethyl phosphate.

8. Process according to claim 2 in which said fluorine-containing gas comprises ethyl hexafluoride gas.

* * * * *

UNITED STATES PATENT AND TRADEMARK OFFICE
CERTIFICATE OF CORRECTION

PATENT NO. : 5,643,640

DATED : July 1, 1997

INVENTOR(S) : Chakravarti et al.

It is certified that error appears in the above-identified patent and that said Letters Patent is hereby corrected as shown below:

In column 5, line 7, after "positive" insert --potential--;
       line 18, after "plasma" change "in" to --on--.

Signed and Sealed this

Twenty-sixth Day of August, 1997

Attest:

BRUCE LEHMAN

*Attesting Officer*     *Commissioner of Patents and Trademarks*